(12) United States Patent
Mala et al.

(10) Patent No.: US 6,934,439 B2
(45) Date of Patent: Aug. 23, 2005

(54) PIANO MEMS MICROMIRROR

(75) Inventors: Mohiuddin Mala, Kanata (CA); John Michael Miller, Aylmer (CA); Graham McKinnon, Edmonton (CA); Yuan Ma, Ottawa (CA)

(73) Assignee: JDS Uniphase Inc., Ottawa (CA)

( * ) Notice: Subject to any disclaimer, the term of this patent is extended or adjusted under 35 U.S.C. 154(b) by 35 days.

(21) Appl. No.: 10/445,360

(22) Filed: May 27, 2003

(65) Prior Publication Data

US 2003/0223679 A1 Dec. 4, 2003

Related U.S. Application Data

(60) Provisional application No. 60/383,106, filed on May 28, 2002.

(51) Int. Cl.[7] ............................. G02B 6/35; G02B 26/08
(52) U.S. Cl. ......................... 385/18; 385/16; 359/223; 359/224
(58) Field of Search ................................. 359/223, 224, 359/290–292, 295, 298; 385/16, 18

(56) References Cited

U.S. PATENT DOCUMENTS

| | | | | |
|---|---|---|---|---|
| 6,201,629 | B1 * | 3/2001 | McClelland et al. | 359/223 |
| 6,327,855 | B1 | 12/2001 | Hill et al. | 60/528 |
| 6,442,307 | B1 | 8/2002 | Carr et al. | 385/18 |
| 6,454,421 | B2 | 9/2002 | Yu et al. | 359/872 |
| 6,491,404 | B2 | 12/2002 | Hill | 359/872 |
| 6,529,652 | B1 | 3/2003 | Brener | 385/16 |
| 6,533,947 | B2 | 3/2003 | Nasiri et al. | 216/2 |
| 6,535,319 | B2 | 3/2003 | Buzzetta et al. | 359/225 |
| 6,545,385 | B2 * | 4/2003 | Miller et al. | 359/291 |
| 6,778,728 | B2 * | 8/2004 | Taylor et al. | 359/224 |
| 2002/0097952 | A1 | 7/2002 | Jin et al. | 385/18 |
| 2002/0122217 | A1 | 9/2002 | Nakajima | 358/505 |
| 2002/0126455 | A1 | 9/2002 | Wood | 361/728 |
| 2003/0012486 | A1 | 1/2003 | Ducellier et al. | 385/17 |
| 2003/0035192 | A1 | 2/2003 | Mizuno et al. | 359/290 |
| 2003/0052569 | A1 | 3/2003 | Dhuler et al. | 310/309 |
| 2003/0086147 | A1 * | 5/2003 | Bruns | 359/291 |

FOREIGN PATENT DOCUMENTS

| | | | | |
|---|---|---|---|---|
| WO | WO01/61400 | 8/2001 | | G02B/26/00 |
| WO | WO01/73934 | 10/2001 | | H02N/1/00 |

OTHER PUBLICATIONS

"Single–Chip 1×84 MEMS Mirror Array for Optical Telecommunication Applications" by Juneau et al, MOEMS and Miniaturized Systems III, James H. Smith, Editor. SPIE vol. 4983 (2003) pp. 53 to 64.

* cited by examiner

*Primary Examiner*—Akm Enayet Ullah
*Assistant Examiner*—Omar Rojas
(74) *Attorney, Agent, or Firm*—Teitelbaum & MacLean; Neil Teitelbaum; Doug MacLean

(57) ABSTRACT

A micro-electro-mechanical (MEMs) mirror device for use in an optical switch is disclosed. A "piano"-style MEMs device includes an elongated platform pivotally mounted proximate the middle thereof by a torsional hinge. The middle portion of the platform and the torsional hinge have a combined width less than the width of the rest of the platform, whereby several of these "piano" MEMs devices can be positioned adjacent each other pivotally mounted about the same axis with only a relatively small air gap therebetween. In a preferred embodiment of the present invention specially designed for wavelength switching applications, a greater range of arcuate motion for a mirror mounted thereon is provided by enabling the platform to rotate about two perpendicular axes. The MEMs mirror device according to the preferred embodiment of the present invention enables the mirror to tilt about two perpendicular axes, by the use of an "internal" gimbal ring construction, which ensures that a plurality of adjacent mirror devices have a high fill factor, without having to rely on complicated and costly manufacturing processes.

20 Claims, 15 Drawing Sheets

PIANO MEMS MICROMIRROR

CROSS-REFERENCE TO RELATED APPLICATIONS

The present invention claims priority from U.S. Patent Application No. 60/383,106 filed May 28, 2002.

TECHNICAL FIELD

The present invention relates to a micro-electro-mechanical (MEMs) mirror device for use in an optical switch, and in particular to a MEMs mirror device with a centrally disposed hinge providing high fill factor mirror spacing.

BACKGROUND OF THE INVENTION

Conventional MEMs mirrors for use in optical switches, such as the one disclosed in U.S. Pat. No. 6,535,319 issued Mar. 18, 2003 to Buzzetta et al, to redirect beams of light to one of a plurality of output ports include an electro-statically controlled mirror pivotable about a single axis. Tilting MEMs mirrors, such as the ones disclosed in U.S. Pat. No. 6,491,404 issued Dec. 10, 2002 in the name of Edward Hill, and U.S. Patent Publication No. 2003/0052569, published Mar. 20, 2003 in the name of Dhuler et al, which are incorporated herein by reference, comprise a mirror pivotable about a central longitudinal axis. The MEMs mirror device, disclosed in the aforementioned Hill patent, is illustrated in FIG. 1, and includes a rectangular planar surface 2 pivotally mounted by torsional hinges 4 and 5 to anchor posts 7 and 8, respectively, above a substrate 9. The torsional hinges may take the form of serpentine hinges, which are disclosed in U.S. Pat. No. 6,327,855 issued Dec. 11, 2001 in the name of Hill et al, and in U.S. Patent Publication No. 2002/0126455 published Sep. 12, 2002 in the name of Robert Wood, which are incorporated herein by reference. In order to position conventional MEMs mirror devices in close proximity, i.e. with a high fill factor, fill factor=width/pitch, they must be positioned with their axes of rotation parallel to each other. Unfortunately, this mirror construction restraint greatly restricts other design choices that have to be made in building the overall switch.

When using a conventional MEMs arrangement, the mirror 1 positioned on the planar surface 2 can be rotated through positive and negative angles, e.g. ±2°, by attracting one side 11 or the other side 12 of the planar surface 2 to the substrate 9. Unfortunately, when the device is switched between ports at the extremes of the devices rotational path, the intermediate ports receive light for fractions of a millisecond as the mirror 1 sweeps the optical beam past these ports, thereby causing undesirable optical transient or dynamic cross-talk.

One solution to the problem of dynamic cross-talk is to initially or simultaneously rotate the mirror about a second axis, thereby avoiding the intermediate ports. An example of a MEMs mirror device pivotable about two axes is illustrated in FIG. 2, and includes a mirror platform 11 pivotably mounted by a first pair of torsion springs 12 and 13 to an external gimbal ring 14, which is in turn pivotally mounted to a substrate 16 by a second pair of torsion springs 17 and 18. Examples of external gimbal devices are disclosed in U.S. Pat. No. 6,529,652 issued Mar. 4, 2003 to Brenner, and U.S. Pat. No. 6,454,421 issued Sep. 24, 2002 to Yu et al. Unfortunately, an external gimbal ring greatly limits the number of mirrors that can be arranged in a given area and the relative proximity thereof, i.e. the fill factor. Moreover, the external gimbal ring may cause unwanted reflections from light reflecting off the support frame.

Another proposed solution to the problem uses high fill factor mirrors, such as the ones disclosed in U.S. Pat. No. 6,533,947 issued Mar. 18, 2003 to Nasiri et al, which include hinges hidden beneath the mirror platform. Unfortunately, these types of mirror devices require costly multi-step fabrication processes, which increase costs and result in low yields.

An object of the present invention is to overcome the shortcomings of the prior art by providing a high fill factor MEMs mirror device that can pivot about the same axis as an adjacent mirror.

Another object of the present invention is to provide a MEMs mirror device that is relatively easy to fabricate, with an internal gimbal ring, applicable in high fill factor applications.

SUMMARY OF THE INVENTION

Accordingly, the present invention relates to a micro-electro-mechanical device for pivotally supporting an optical element on a substrate comprising:

a platform for supporting the element, the platform including first and second supporting regions each defined by a width and a length, and brace means extending therebetween defined by a width and a length;

a first torsional hinge, rotatable about a first axis perpendicular to said brace means, and extending between at least one anchor post of the substrate and the platform proximate the brace means;

wherein the total width of the first torsional hinge and said brace means is less than the width of the first or the second supporting regions, whereby a plurality of platforms pivotable about the first axis are positionable in close proximity with only an air gap between adjacent first supporting regions.

BRIEF DESCRIPTION OF THE DRAWINGS

The invention will be described in greater detail with reference to the accompanying drawings which represent preferred embodiments thereof, wherein.

DETAILED DESCRIPTION

Figure 3:
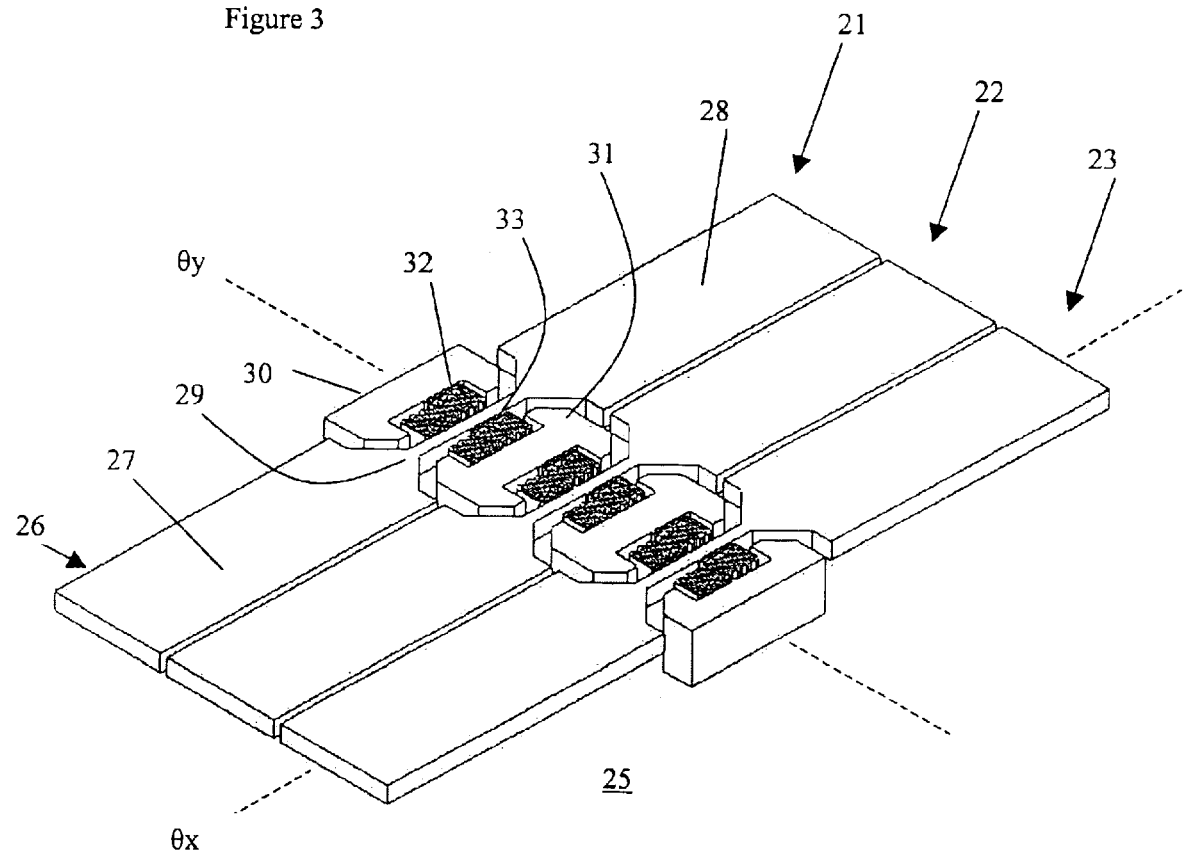
FIG. 3 is an isometric view of a plurality of Piano-MEMs mirror devices according to the present invention.
Figure 4:
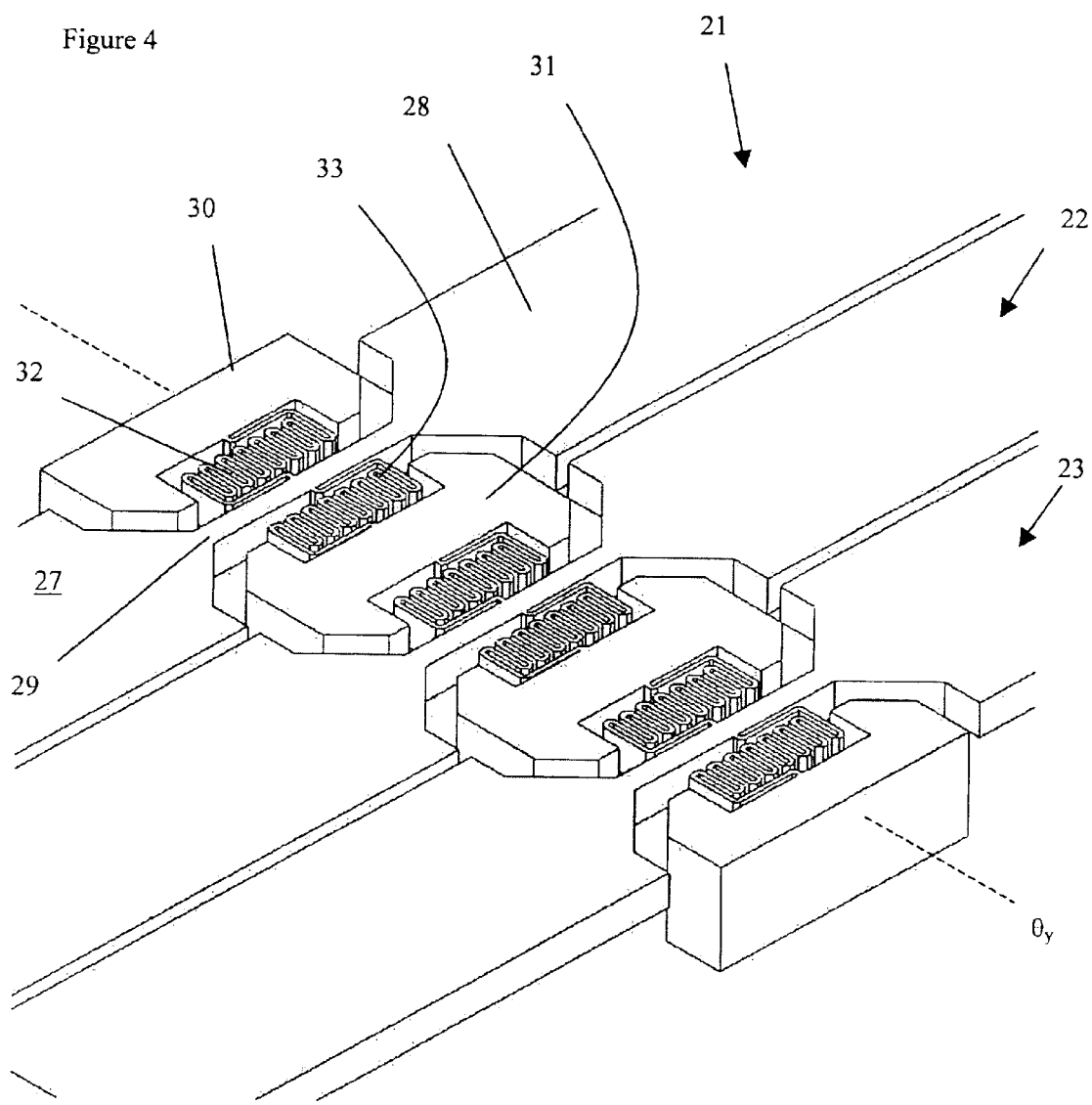
FIG. 4 is an isometric view of a hinge structure of the mirror devices of FIG. 3.
Figure 5:
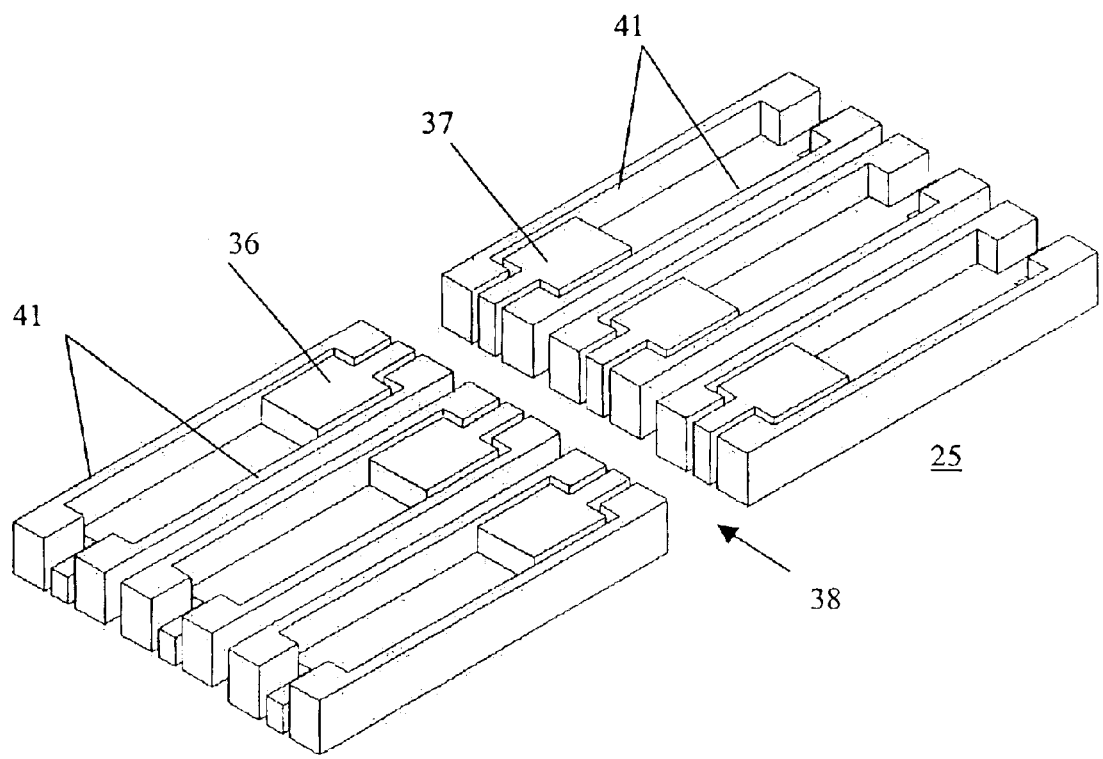
FIG. 5 is an isometric view of an electrode structure of the mirror devices of FIG. 3.

In accordance with the present invention an array of "Piano" MEMs mirror devices 21, 22 and 23, which pivot about a single axis of rotation $\theta_y$ above a substrate 25, is illustrated in FIGS. 3, 4 and 5. Each mirror device 21, 22 and 23 includes a pivoting platform 26 defined by first and second substantially-rectangular planar supporting regions 27 and 28 joined by a relatively-thin substantially-rectangular brace 29 extending therebetween. Typically, each planar surface is coated with a reflective coating, e.g. gold, for simultaneously reflecting a pair of sub-beams of light traveling along parallel paths, as will be hereinafter discussed. Each brace 29 acts like a lever and is pivotally mounted to anchor posts 30 and 31 via first and second torsional hinges 32 and 33, respectively. The anchor posts 30 and 31 extend upwardly from the substrate 25. The ends of the first torsional hinge 32 are connected to the anchor post 30 and the brace 29 along the axis $\theta_y$. Similarly, the ends of the second torsional hinge 32 are connected to the anchor post 31 and the brace 29 along the axis $\theta_y$. Preferably, each of the first and second torsional hinges 32 and 33 comprises a serpentine hinge, which are considerably more robust than conventional torsional beam hinges. The serpentine hinge is effectively longer than a normal torsional hinge, which spans the same distance, thereby providing greater deflection and strength, without requiring the space that would be needed to extend a normal full-length torsional hinge.

With particular reference to FIG. 5, each platform 26 is rotated by the selective activation of a first electrode 36, which electrostatically attracts the first planar section 27 thereto or by the selective activation of a second electrode 37, which electrostatically attracts the second planar section 28 thereto. A gap 38, illustrated in FIG. 5, is provided between the first and second electrodes 36 and 37 for receiving the anchor posts 31, which extend from the substrate 35 to adjacent the platforms 26.

Figure 6:
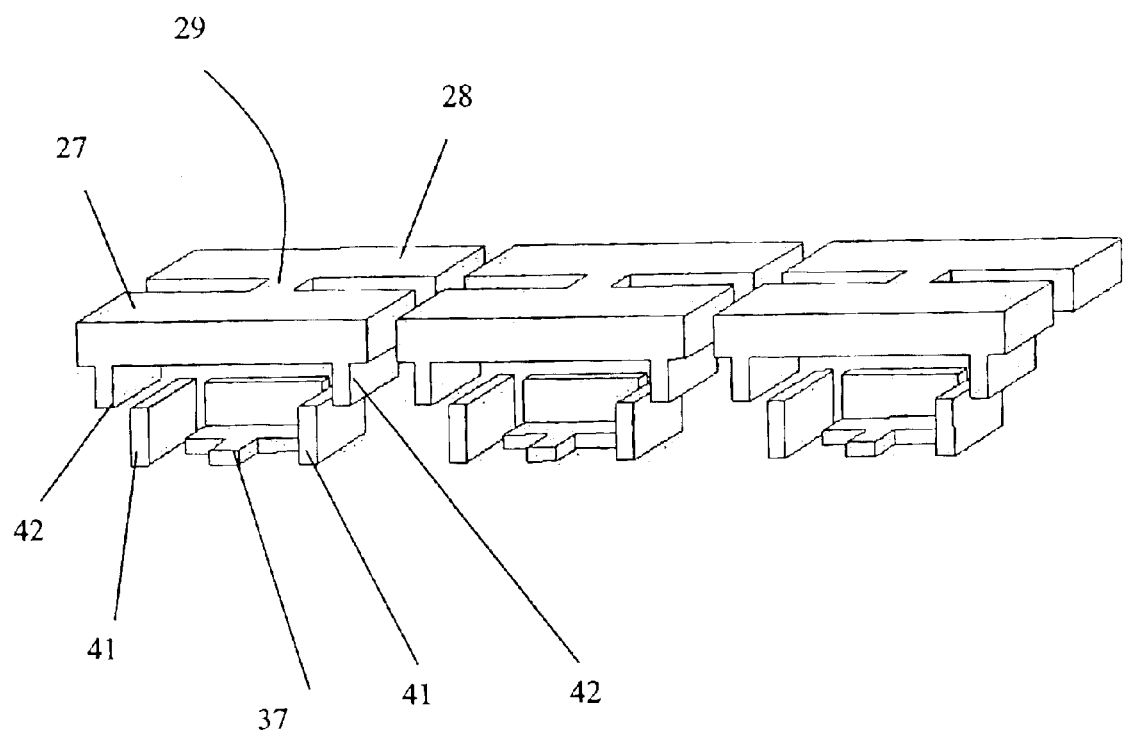
FIG. 6 is an isometric view of a plurality of Piano-MEMs mirror devices according to an alternative embodiment of the present invention.

A consequence of closely packed micro-mirrors is that the actuation of a single mirror will impart a torque, i.e. an angular rotation, onto adjacent mirrors as a result of fringing electric fields. In an effort to minimize this cross-talk, electrode grounding shields 41 are positioned on the substrate 25 around the first and second electrodes 36 and 37 forming electrode cavities, which are electrically isolated from each other. The grounding shields 41 are kept at ground potential, i.e. the same as the mirrored platforms 26, while one of the first and second electrodes is held at an activation voltage, e.g. 100 Volts. To further eliminate cross-talk between adjacent electrodes, additional platform shields 42 (FIG. 6) can be added to the underside of the platform 26, outside or inside of the electrode shields 41. Typically, in the rest position, the two different sets of shields 41 and 42 do not overlap; however, as the platform 26 tilts the platform shields 42 begin to overlap the grounding shielding 41. The added protection provided by overlapping shielding is particularly advantageous, when the tilt angle of the platform 26 is proportional to the voltage applied to the electrode 36 (or 37), such as in open loop configurations. Accordingly, the greater the tilt angle, the greater the required voltage, and the greater the amount of potential cross-talk, but consequently the greater the amount of shielding provided by the overlapping ground and platform shields 41 and 42, respectively.

Figure 7:
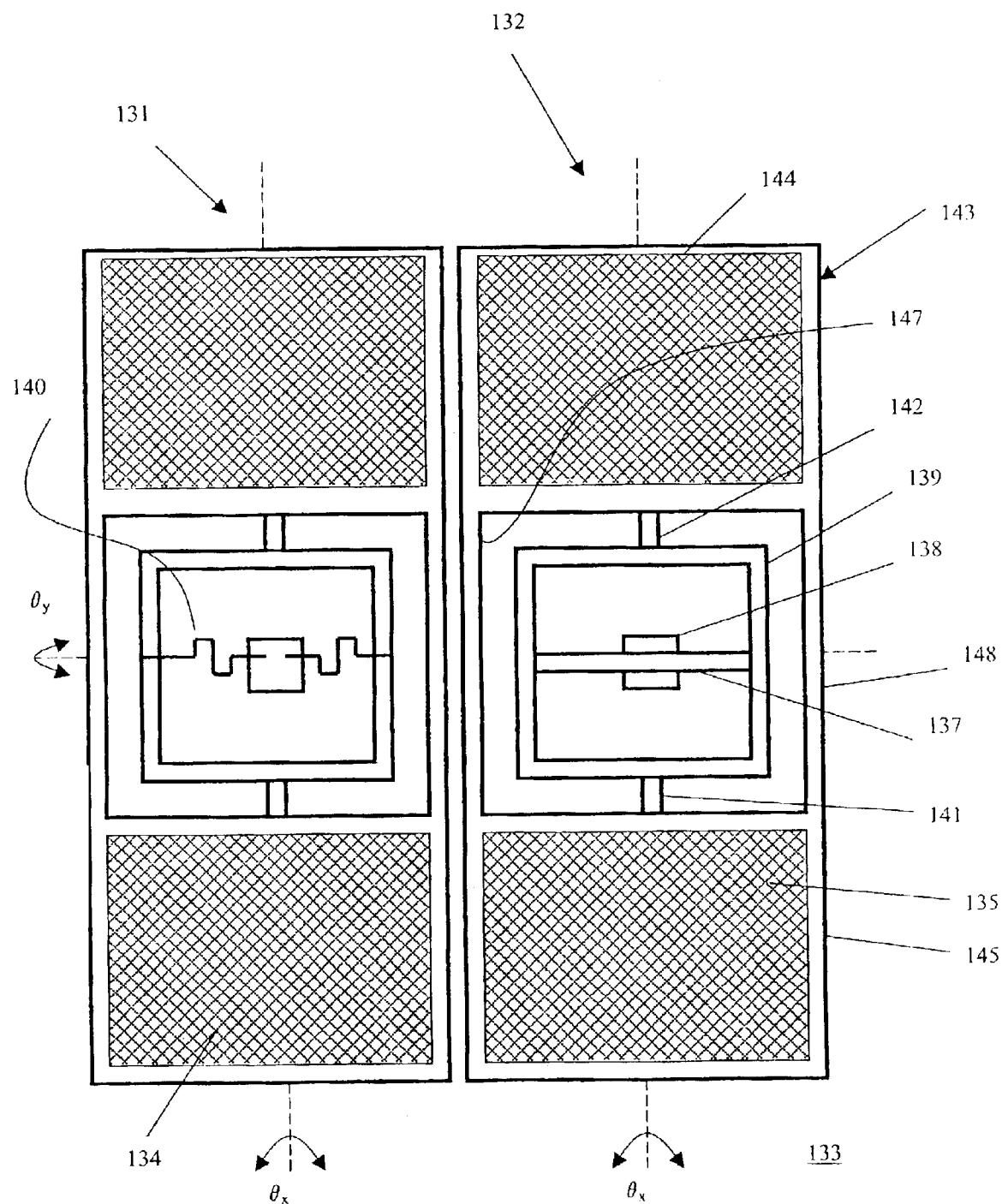
FIG. 7 is a plan view of a pair of internal gimbal ring MEMs mirror devices according to the present invention.

With reference to FIG. 7, a pair of internal gimbal ring MEMs mirror devices 131 and 132 are illustrated mounted adjacent each other on a substrate 133. The present invention enables mirrors 134 and 135 to be positioned relatively close together, i.e. with a high fill factor, while still providing the two degrees of motion provided by the more complicated prior art.

Figure 8:
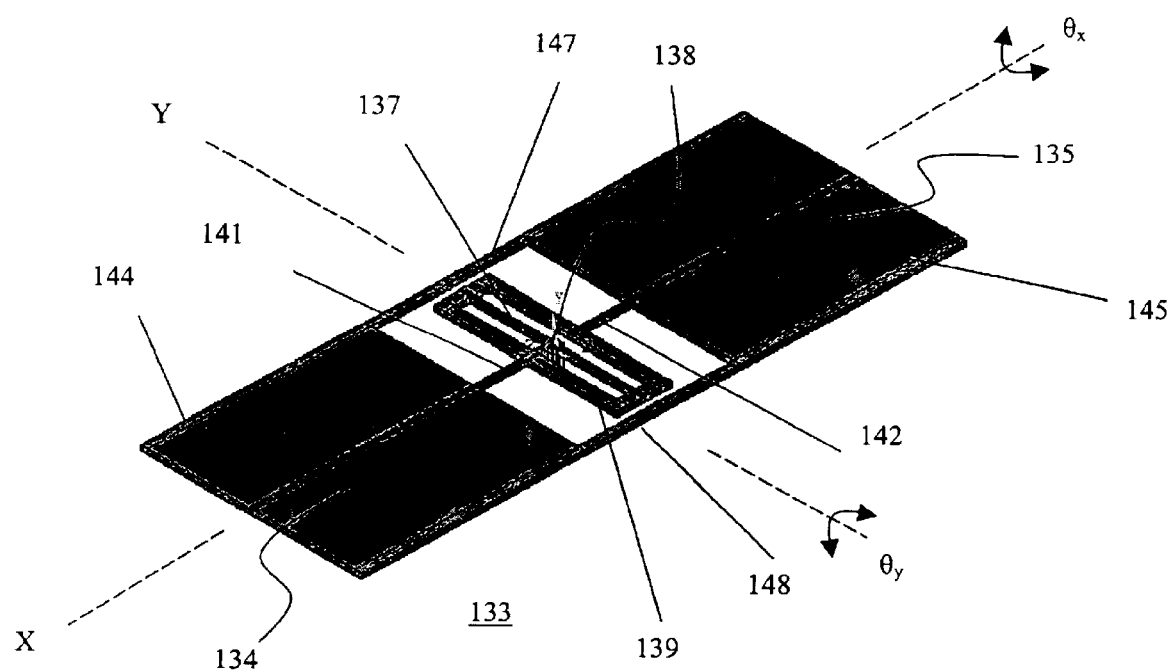
FIG. 8 is an isometric view of an internal gimbal ring MEMs mirror device according to the present invention.

With further reference to FIG. 8, a first torsion hinge 137, preferably in the form of a rectangular beam, is fixed, proximate the middle thereof, to the substrate 133 via a central anchor post 138. The supporting structure for the mirror device of the present invention is based on a single anchor post 138, rather than the dual anchor points required in the aforementioned external gimbal ring devices. The first torsion hinge 137 provides for rotation about a first axis $\theta_y$, and may also include a serpentine hinge 140, as illustrated in mirror device 131, or any other torsional hinge known in the art. Opposite sides of an internal gimbal ring 139 are connected to opposite ends of the first torsion hinge 137, whereby the first torsion hinge 137 bisects the internal gimbal ring 139. The internal gimbal ring 139 is preferably not flexible, but can take various geometric forms, although rectangular or circular frames would be the most convenient to fabricate and use. Spring arms 141 and 142, which define a second torsion hinge, extend outwardly from opposite sides of the internal gimbal ring 139 perpendicular to the first torsion hinge 137. Each of the spring arms may also include a serpentine hinge as hereinbefore described. The second torsion hinge provides for rotation about a second axis $\theta_x$, which is perpendicular to the first axis $\theta_y$, but still substantially in the same plane as the mirrors 134 and 135. A generally rectangular platform 143, for supporting one of the mirrors 134 or 135, is mounted on the ends of the spring arms 141 and 142. Preferably, the platform 143 is comprised of a pair of rectangular planar surfaces 144 and 145 joined together by a pair of elongated braces 147 and 148, which extend on either side of the internal gimbal ring 139 parallel with the spring arms 141 and 142.

Figure 1:
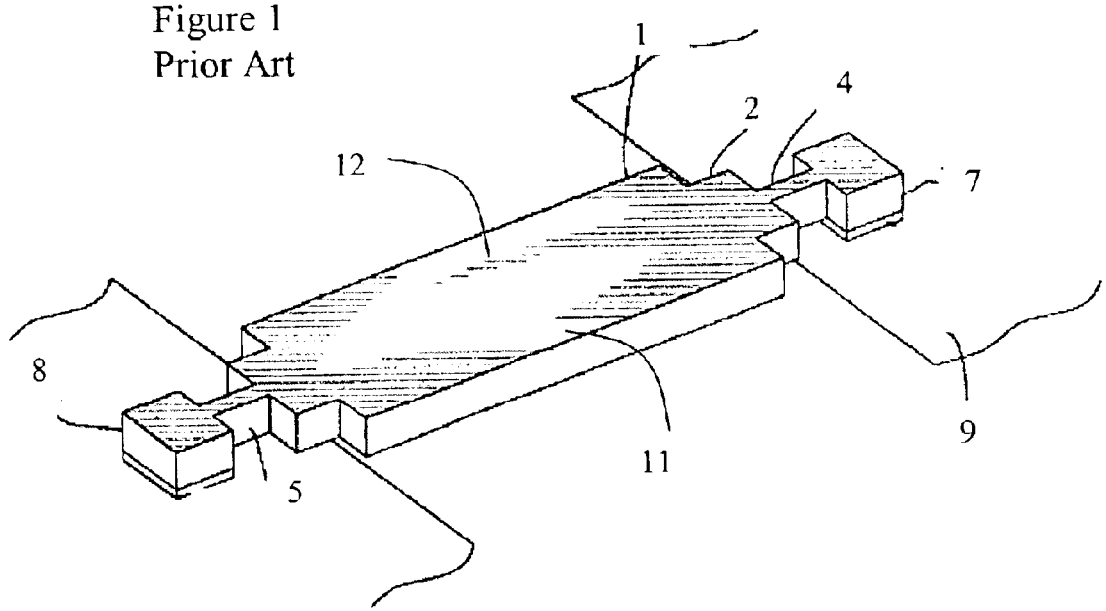
FIG. 1 is an isometric view of a conventional tilting MEMs mirror device.
Figure 2:
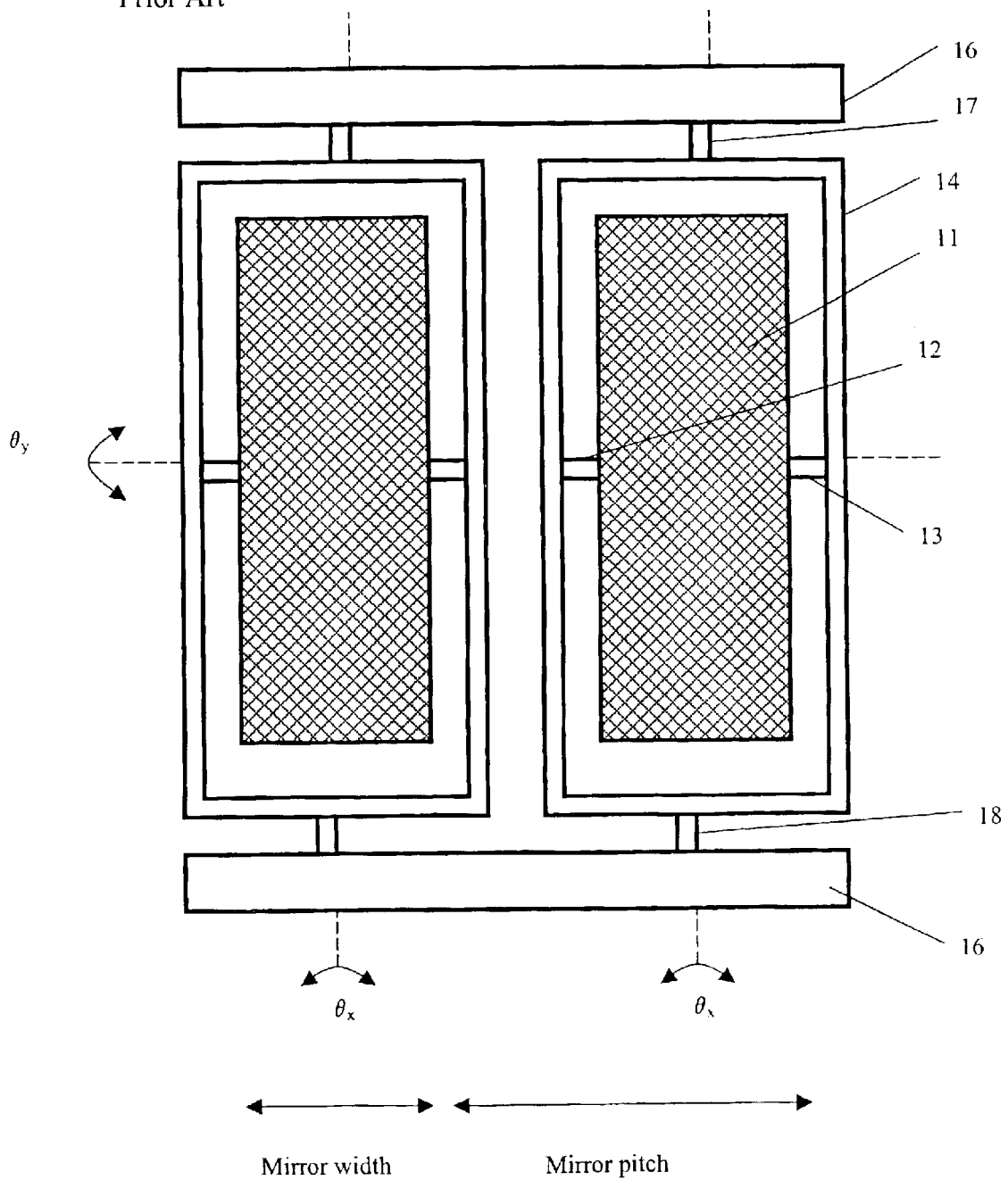
FIG. 2 is a plan view of a pair of conventional external gimbal ring MEMs mirror devices.

Fabrication of the preferred embodiment illustrated in FIGS. 7 and 8, is simplified by having all of the structural elements, i.e. the first torsional hinge 137, the gimbal ring 139, the spring arms 141 and 142, and the first and second planar surfaces 144 and 145, in the same upper substrate layer and having coplanar upper surfaces, whereby the same basic process steps are used as are used to fabricate the MEMs device illustrated in FIG. 1. In particular, a single photolithographic step is used to identify the structural elements, followed by a deep reactive ion etching (DRIE) step used to remove the unwanted portions of the upper substrate. Finally the moveable elements in the upper substrate are released from the lower substrate by removal of a sacrificial layer therebetween.

Figure 9:
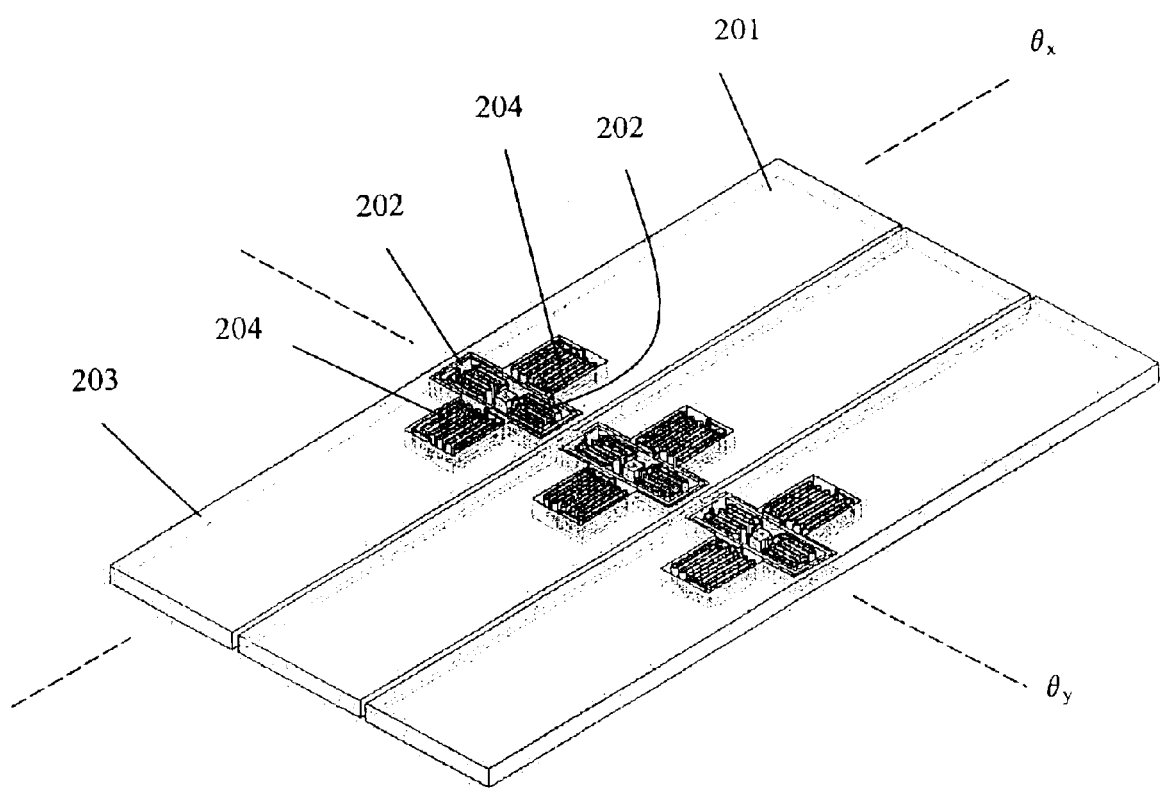
FIG. 9 is an isometric view of an alternative embodiment of the internal gimbal ring MEMs mirror devices according to the present invention.
Figure 10:
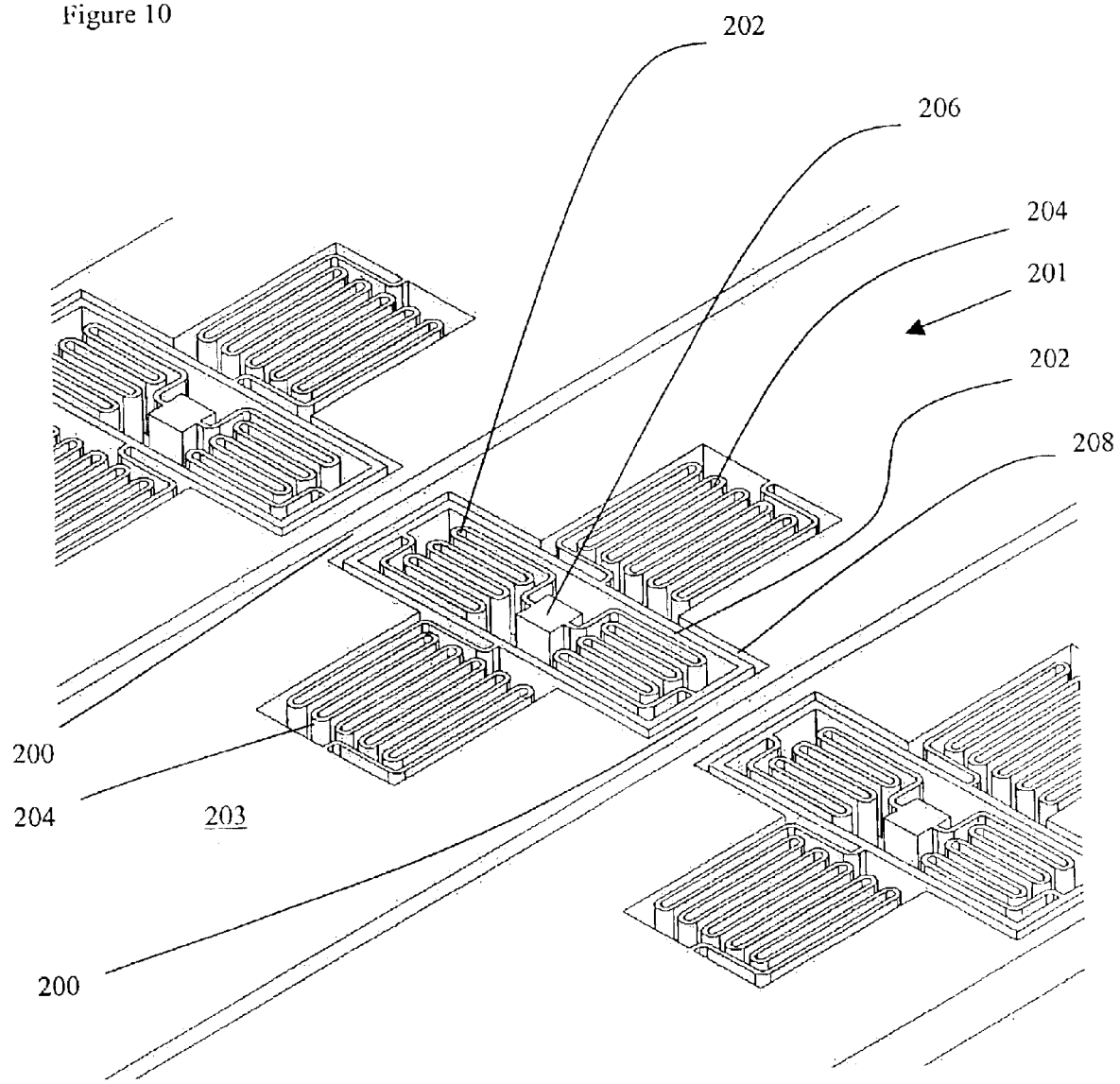
FIG. 10 is an isometric view of a hinge structure of the mirror devices of FIG. 9.

FIGS. 9 and 10 illustrate an array of internal gimbal ring MEMs mirror devices 201 utilizing a first pair of serpentine torsional hinges 202 for pivoting a rectangular platform 203 about a first axis of rotation $\theta_x$, and a second pair of serpentine torsional hinges 204 for rotating the platform 203 about a second axis of rotation $\theta_y$ above a base substrate 205. The first pair of serpentine torsional hinges 202 extend from a single anchor post 206, which extends upwardly from the base substrate 205 through the center of the platform 203, i.e. at the intersection of the minor and major axes thereof. Outer ends of the first pair of torsional serpentine torsional hinges 202 are connected to a rectangular gimbal ring 208, which surrounds the first pair of serpentine hinges 202, at points along the minor axes ($\theta_y$) of the platform 203. The second pair of serpentine torsional hinges 204 extend from opposite sides of the gimbal ring 208 into contact with the platform 203, at points along the major axis ($\theta_x$) of the platform 203.

Figure 11:
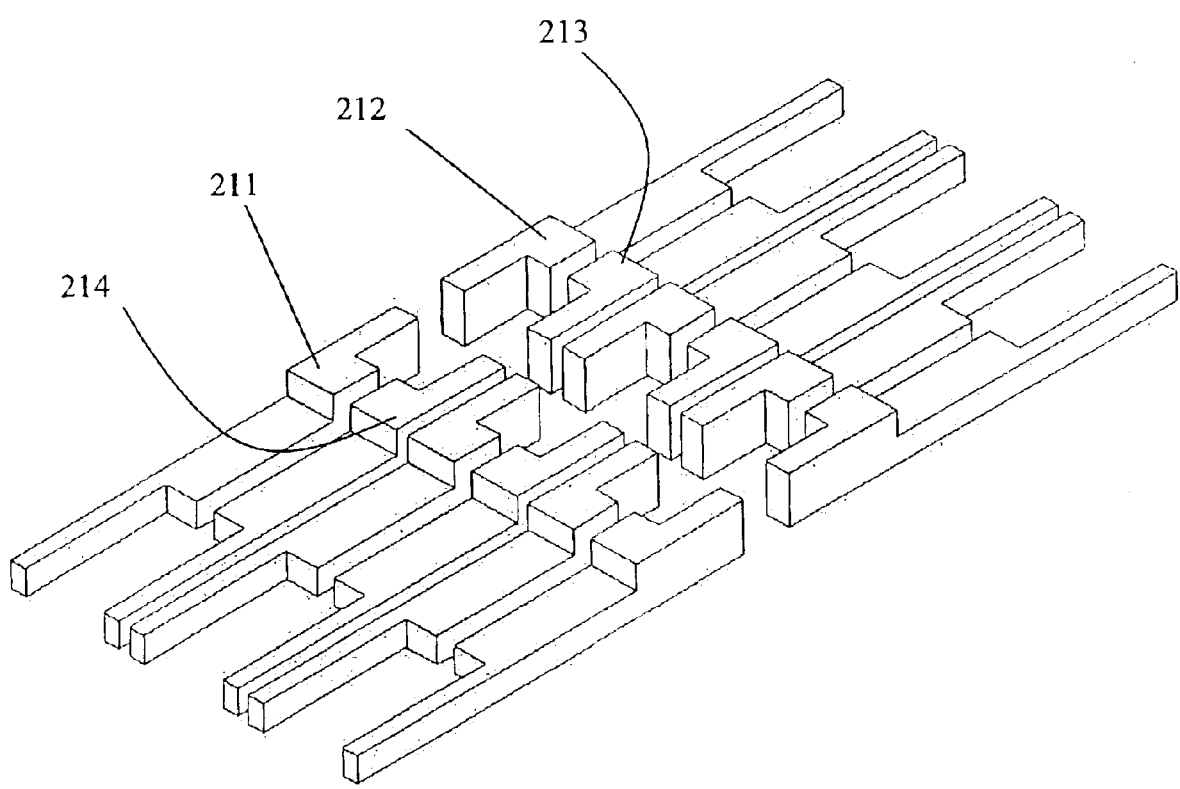
FIG. 11 is an isometric view of an electrode structure of the mirror devices of FIGS. 9 and 10.
Figure 12:
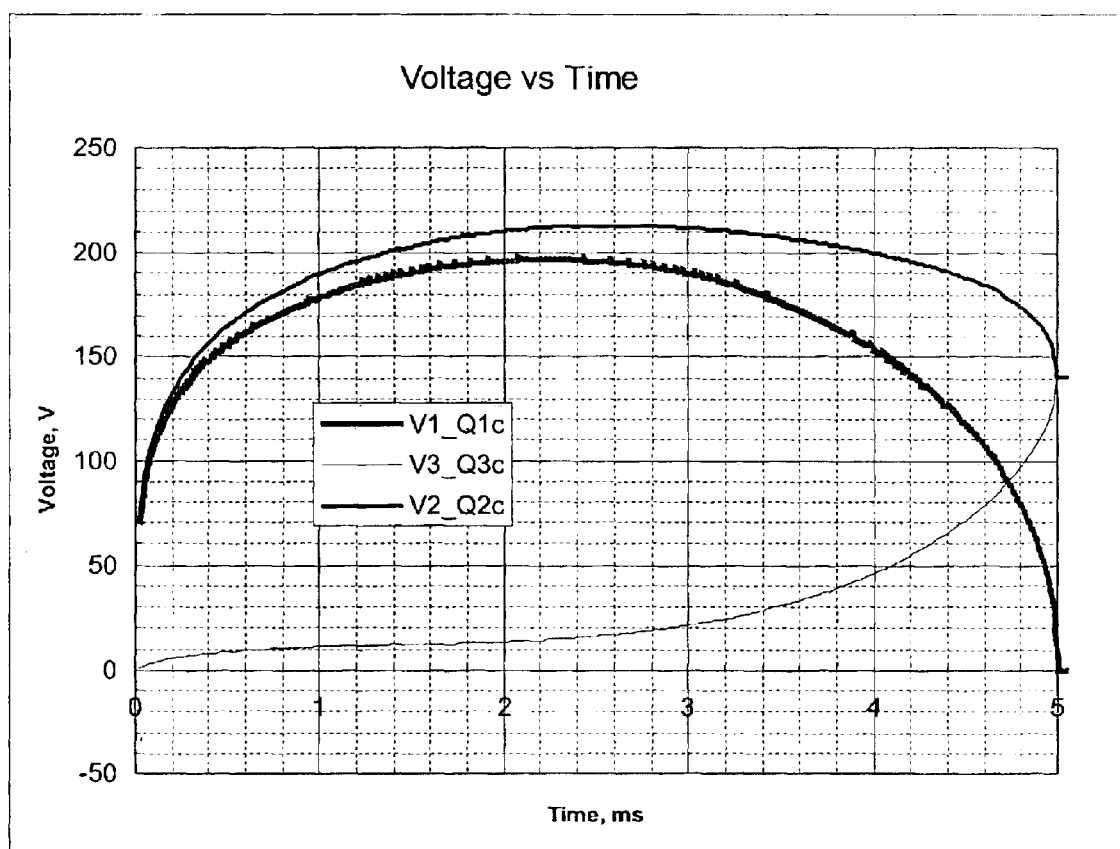
FIG. 12 is a graph of Voltage vs Time provided by the electrode structure of FIG. 11.

To provide a full range of motion for the platform 143 or 203, a set of four electrodes 211, 212, 213 and 214 are provided (See FIG. 11); however, for the present invention only the first, second and third electrodes 211, 212 and 213 are required to roll the mirrors out of alignment with any intermediate output ports and then back into alignment with a designated output port. Accordingly, first, second and third voltages can be established between the platform 143 or 203 and the first electrode 211, the second electrode 212 and the third electrode 213, respectively. Initially, the first and second electrodes 211 and 212 are activated to rotate the platform 143 or 203 about $\theta_x$. Subsequently, the first voltage is gradually lowered to zero, while the third voltage is gradually increased until it is equivalent to the second voltage (See FIG. 12). To minimize unwanted effected caused by ringing, i.e. vibration of the mirrors caused by an abrupt start or stop, the first, second and third voltages are increased gradually, as evidenced in FIG. 12, which illustrates the voltages curves for the various electrodes (first, second and third) over the actuation time of the mirror device. Various mirror tilting patterns can be designed based on the desired characteristics, e.g. attenuation, of the light.

Figure 13:
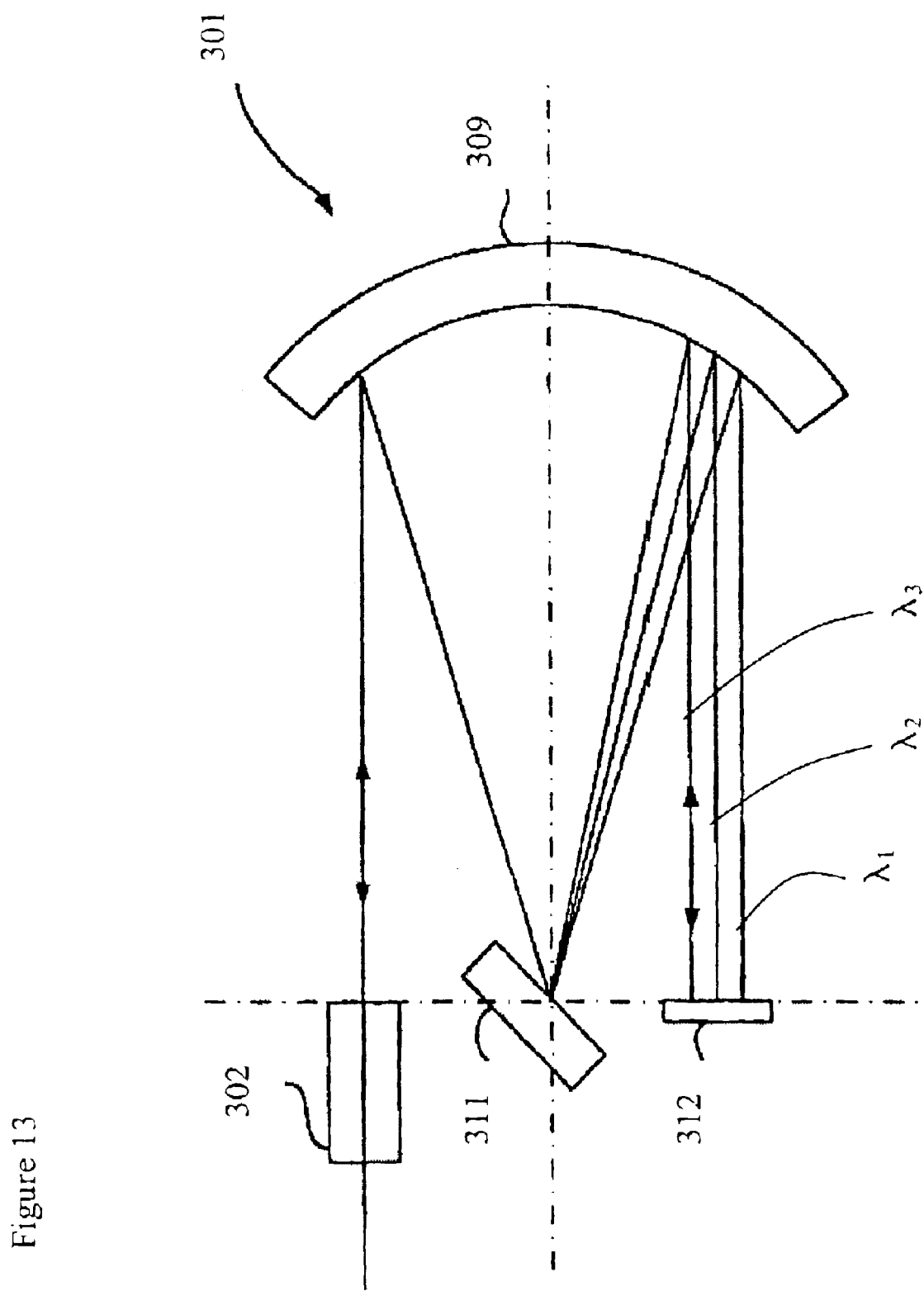
FIG. 13 is a schematic diagram of a wavelength switch utilizing the mirror devices of the present invention.
Figure 14:
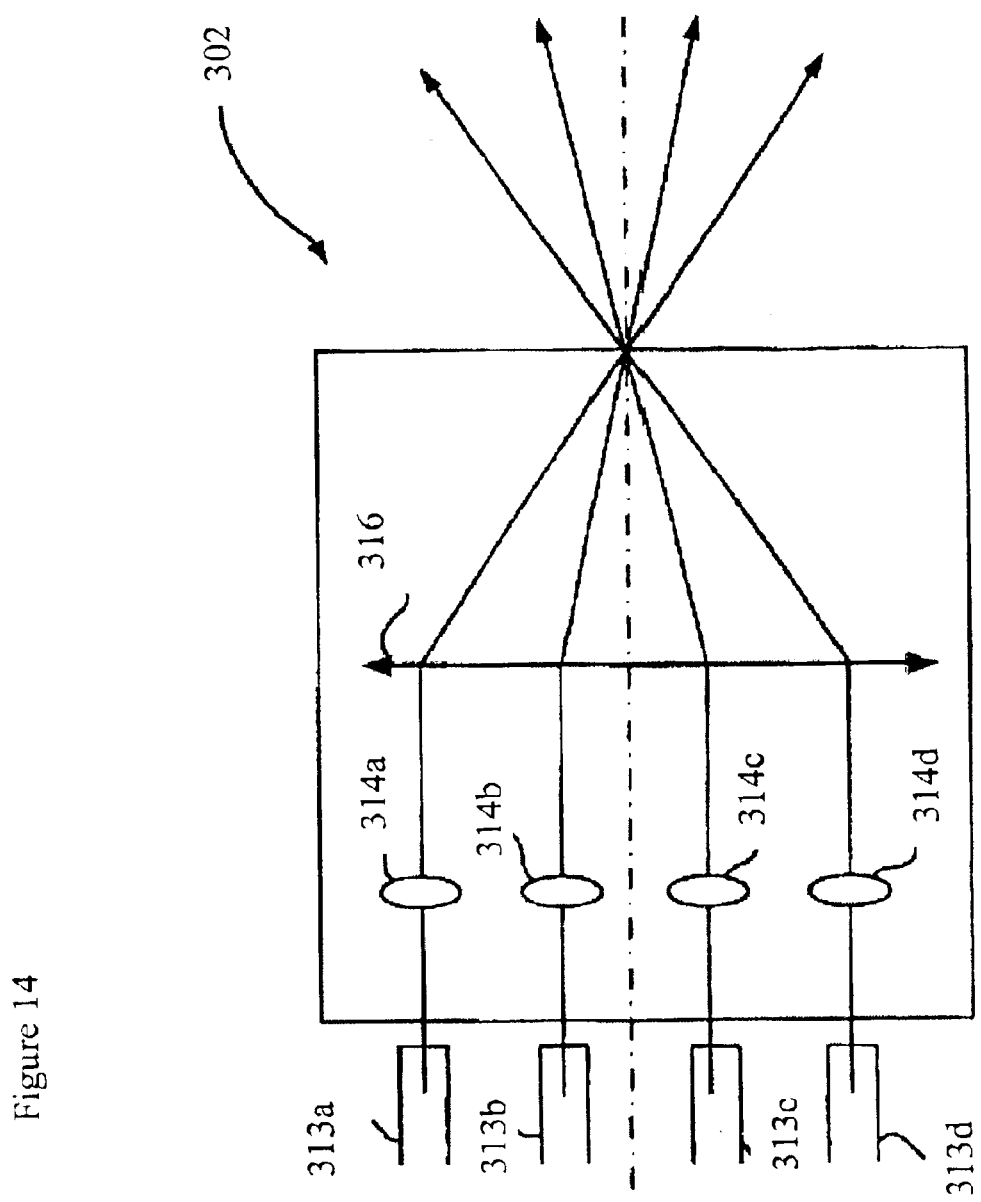
FIG. 14 is a schematic diagram of an input/output assembly for the wavelength switch of FIG. 13.
Figure 15:
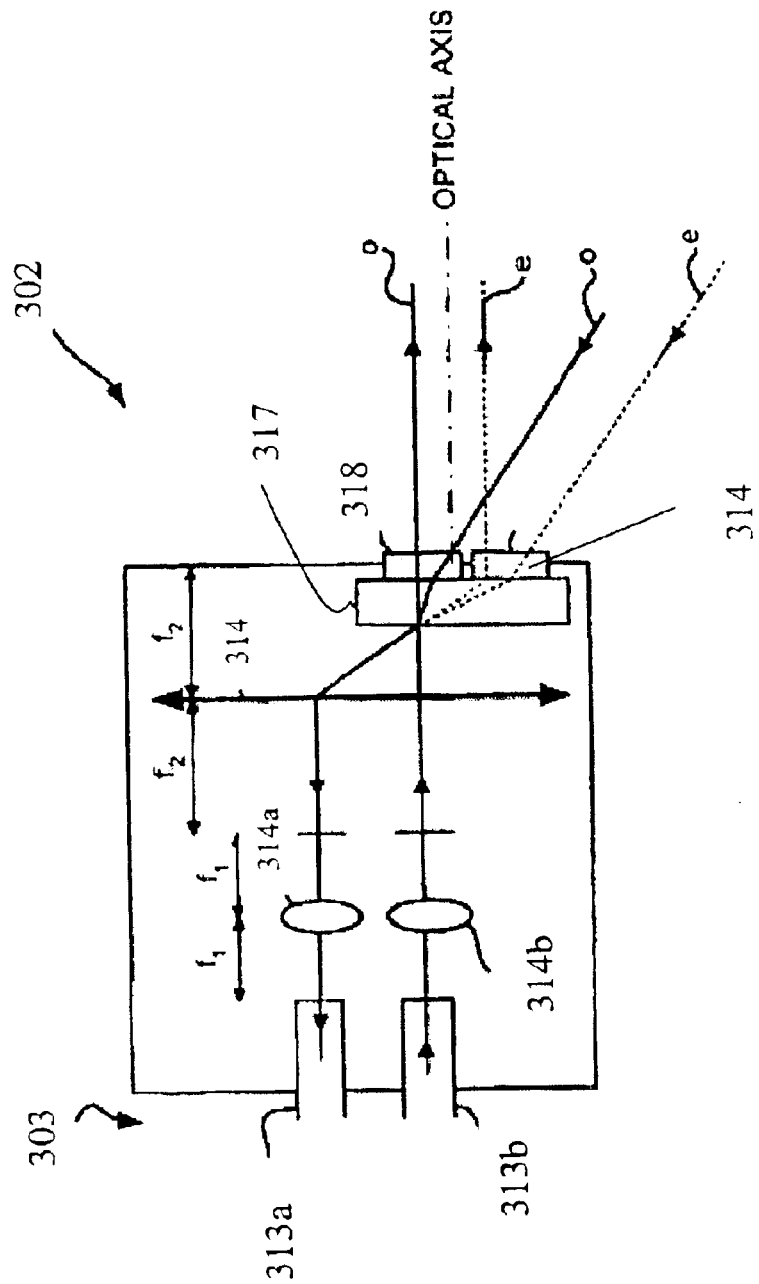
FIG. 15 is a schematic diagram of an alternative embodiment of an input assembly for the wavelength switch of FIG. 13.

The "piano" MEMs mirror devices according to the present invention are particularly useful in a wavelength switch 301 illustrated in FIGS. 13, 14 and 15. In operation, a beam of light with a plurality of different wavelength channels is launched via an input/output assembly 302, which comprises a plurality of input/output ports, e.g. first, second, third and fourth input/output ports 303, 304, 305 and 306, respectively. The beam is directed to an element having optical power, such as concave mirror 309, which redirects the beam to a dispersive element 311, e.g. a Bragg grating. The dispersive element separates the beam into the distinct wavelength channels ($\lambda_1, \lambda_2, \lambda_3$), which are again directed to an element having optical power, e.g. the concave mirror 309. The concave mirror 309 redirects the various wavelength channels to an array of "piano" MEMs mirror devices 312 according to the present invention, which are independently controlled to direct the various wavelength channels back to whichever input/output port is desired. Wavelength channels designated for the same port are reflected back off the concave mirror 309 to the dispersive element 311 for recombination and redirection off the concave mirror 309 to the desired input/output port. The concave mirror 309 can be replaced by a single lens with other elements of the switch on either side thereof or by a pair of lenses with the dispersive element 311 therebetween.

With particular reference to FIG. 14, the input/output assembly 302 includes a plurality of input/output fibers 313a to 313d with a corresponding collimating lens 314a to 314d. A single lens 316 is used to convert a spatial offset between the input/output ports into an angular offset. FIG. 15 illustrates a preferred embodiment of the input/output assembly, in which the unwanted effects of polarization diversity are eliminated by the use of a birefringent crystal 317 and a waveplate 318. For incoming beams, the lens 316 directs each beam through the birefringent crystal 317, which separates the beam into two orthogonally polarized sub-beams (o and e). The half waveplate 318 is positioned in the path of one of the sub-beams for rotating the polarization thereof by 90°, so that both of the sub-beams have the same polarization for transmission into the remainder of the switch. Alternatively, the waveplate 318 is a quarter waveplate and rotates one of the sub-beams by 45° in one direction, while another quarter waveplate 319 rotates the other sub-beam by 45° in the opposite direction, whereby both sub-beams have the same polarization. For outgoing light, the polarization of one (or both) of the similarly polarized sub-beams are rotated by the waveplate(s) 318 (and 319), so that the sub-beams become orthogonally polarized. The orthogonally polarized sub-beams are then recombined by the birefringent crystal 317 and output the appropriate input/output port. The micro-electro-mechanical devices according to the present invention are particularly well suited for use in switching devices with polarization diversity front ends, since they provide a pair of reflecting surfaces, i.e. one for each sub-beam.

We claim:

1. A micro-electro-mechanical device for pivotally supporting an optical element on a substrate comprising:
   a platform for supporting the element, the platform including first and second supporting regions each defined by a width and a length, and brace means extending therebetween defined by a width and a length;
   a first torsional hinge, rotatable about a first axis perpendicular to said brace means, and extending between at least one anchor post of the substrate and the platform;
   wherein the total width of the first torsional hinge and said brace means is less than the width of the first or the second supporting regions, whereby a plurality of platforms pivotable about the first axis are positionable in close proximity with only an air gap between adjacent first supporting regions.

2. The device according to claim 1, wherein said brace means comprises a single lever extending between said first and second supporting regions along an axis which includes the longitudinal central axes of the first and second supporting regions; and
   wherein the first torsional hinge includes a first spring arm extending between a first anchor post and the lever, and a second spring arm extending between a second anchor post and the lever.

3. The device according to claim 2, wherein the first spring arm includes a first serpentine spring arm; and wherein the second spring arm includes a second serpentine spring arm.

4. The device according to claim 1, wherein the first torsional hinge includes a serpentine torsional hinge.

5. The device according to claim 1, further comprising:
   first and second electrodes positioned on the substrate beneath the first and second supporting regions, respectively, for selectively controlling the position of the platform; and
   shielding positioned on opposite sides of the first and second electrodes for reducing fringing electric fields from pivoting platforms on adjacent devices.

6. The device according to claim 5, wherein said shielding comprises shields protruding from underneath of the first and second supporting regions on opposite sides of the first and second electrodes.

7. The device according to claim 1, further comprising:
   a gimbal ring surrounding the first torsional hinge, opposite ends of the first torsional hinge being fixed to opposite sides of the gimbal ring; and a second torsional hinge rotatable about a second axis perpendicular to the first axis, the second torsional hinge comprising first and second spring arms extending from opposite sides of the gimbal ring into contact with the first and second supporting regions, respectively.

8. The device according to claim 7, wherein the first torsional hinge comprises first and second spring arms extending outwardly from a single anchor post, which extends upwardly from the substrate.

9. The device according to claim 8, wherein the first torsional hinge comprises first and second serpentine spring arms extending outwardly from the single anchor post; and wherein the second torsional hinge comprises third and fourth serpentine spring arms extending from opposite sides of the gimbal ring.

10. The device according to claim 1, wherein upper surfaces of the first torsional hinge, the gimbal ring, the second torsional hinge and the platform are all coplanar, thereby facilitating manufacture.

11. A micro-electro-mechanical device for pivotally supporting an at least partially reflective surface on a substrate comprising:

a first torsional hinge mounted on the substrate, rotatable about a first axis;

a gimbal ring surrounding the first torsional hinge, opposite ends of the first torsional hinge being fixed to opposite sides of the gimbal ring;

a second torsional hinge rotatable about a second axis perpendicular to the first axis, the second torsional hinge comprising first and second arms extending from opposite sides of the gimbal ring, respectively; and a platform for supporting the reflective surface connected to the second torsional hinge;

wherein the total width of the first torsional hinge, said gimbal ring and said brace means is less than the width of the platform, whereby a plurality of platforms pivotable about the first and second axes are positionable in close proximity with only an air gap between adjacent platforms.

12. The device according to claim 11, wherein upper surfaces of the first torsional hinge, the gimbal ring, the second torsional hinge and the platform are all coplanar.

13. A micro-electro-mechanical device for pivotally supporting an at least partially reflective surface on a substrate comprising:

a first torsional hinge mounted on the substrate, rotatable about a first axis;

a gimbal ring substantially surrounding the first torsional hinge, opposite ends of the first torsional hinge being fixed to opposite sides of the gimbal ring;

a second torsional hinge rotatable about a second axis perpendicular to the first axis, the second torsional hinge comprising first and second arms extending from opposite sides of the gimbal ring, respectively; and a platform for supporting the reflective surface connected to the second torsional hinge;

wherein upper surfaces of the first torsional hinge, the gimbal ring, the second torsional hinge and the platform are all coplanar;

wherein the platform comprises a first supporting region attached to the first arm for supporting a first reflective surface, a second supporting region with a second reflective surface attached to the second arm for supporting a second reflective surface, and a pair of braces extending between the first and second supporting regions on either side of the gimbal ring.

14. The device according to claim 11, wherein at least one of the first and second torsional hinges includes a serpentine hinge.

15. A micro-electro-mechanical device for pivotally supporting an at least partially reflective surface on a substrate comprising:

a first torsional hinge mounted on the substrate, rotatable about a first axis;

a gimbal ring substantially surrounding the first torsional hinge, opposite ends of the first torsional hinge being fixed to opposite sides of the gimbal ring;

a second torsional hinge rotatable about a second axis perpendicular to the first axis, the second torsional hinge comprising first and second arms extending from opposite sides of the gimbal ring, respectively; and a platform for supporting the reflective surface connected to the second torsional hinge;

wherein the first torsion hinge is mounted on the substrate via a single anchor post extending upwardly from the substrate with the first torsion hinge extending outwardly from an outer free end of the anchor post perpendicular thereto.

16. The device according to claim 13, further comprising:

a first electrode positioned on the substrate underneath one side of the first supporting region;

a second electrode positioned on the substrate underneath one side of the second supporting region; and a third electrode positioned on the substrate underneath another side of the second supporting region;

whereby the first and second electrodes control the pivoting of the platform about the second axis, and the second and third electrodes control the pivoting of the platform about the first axis.

17. A wavelength switch for controlling the direction of individual wavelength channels from an input optical signal to one or more of a plurality of output ports comprising:

an input port for launching the input optical signal, and for dividing the input optical signal into first and second sub-beams having the same polarization;

a dispersive element for dividing each of the first and second sub-beams into distinct wavelength channels;

a plurality of micro-electro-mechanical devices, each device for pivotally supporting first and second reflective surface on a substrate, each device comprising:

a platform including first and second supporting regions, each defined by a width and a length for supporting the first and second reflective surfaces, respectively, and brace means extending therebetween defined by a width and a length;

a first torsional hinge, rotatable about a first axis perpendicular to said brace means, and extending between at least one anchor post of the substrate and the platform proximate the brace means;

first and second electrodes positioned on the substrate beneath the first and second supporting regions, respectively, for selectively controlling the position of the platform;

wherein the total width of the first torsional hinge and said brace means is less than the width of the first or the second supporting regions, whereby the plurality of micro-electro-mechanical devices are positionable in close proximity with each other with only an air gap between adjacent first supporting regions and between adjacent second supporting regions;

whereby the micro-electro-mechanical devices are independently controllable for directing any number of the wavelength channels back to the dispersive element for recombination and output any one of the output ports.

18. The device according to claim 17, further comprising an element with optical power for focusing and redirecting the input optical signal and the wavelength channels between the input port, the dispersive element and the micro-electro-mechanical devices.

19. The device according to claim 18, wherein the element with optical power comprises a concave mirror.

20. The device according to claim 17, wherein the first torsional hinge comprises:
- a first serpentine spring arm extending between a first anchor post, which extends upwardly from the substrate, and the brace; and
- a second serpentine spring arm extending between a second anchor post, which extends upwardly from the substrate, and the brace.

* * * * *